(12) United States Patent
Yamazaki

(10) Patent No.: US 6,570,412 B2
(45) Date of Patent: May 27, 2003

(54) FILTER CHARACTERISTIC REGULATING APPARATUS AND REGULATING METHOD THEREFOR

(75) Inventor: Hiroshi Yamazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/923,544

(22) Filed: Aug. 8, 2001

(65) Prior Publication Data

US 2001/0054929 A1 Dec. 27, 2001

Related U.S. Application Data

(62) Division of application No. 09/362,707, filed on Jul. 29, 1999, now Pat. No. 6,307,427.

(30) Foreign Application Priority Data

Aug. 6, 1998 (JP) .......... 10-222198
Aug. 18, 1998 (JP) .......... 10-231548

(51) Int. Cl.[7] .......... H03K 5/40; H02M 11/00
(52) U.S. Cl. .......... 327/103; 327/552; 327/553
(58) Field of Search .......... 327/562, 552, 327/103, 344, 437; 330/258, 252

(56) References Cited

U.S. PATENT DOCUMENTS

| | | | |
|---|---|---|---|
| 4,257,018 A | | 3/1981 | Masdea et al. .......... 333/17.1 |
| 4,812,773 A | | 3/1989 | Yamamoto et al. .......... 327/553 |
| 4,819,903 A | | 4/1989 | Jimenez .......... 307/521 |
| 5,614,855 A | * | 3/1997 | Lee et al. .......... 327/158 |
| 5,650,747 A | * | 7/1997 | Chen .......... 327/552 |
| 5,963,064 A | * | 10/1999 | Toyota et al. .......... 327/103 |
| 5,986,502 A | * | 11/1999 | Nakamura .......... 330/258 |

FOREIGN PATENT DOCUMENTS

| | | |
|---|---|---|
| EP | 0 829 960 A2 | 3/1988 |
| EP | 0 461 922 A2 | 12/1991 |
| JP | 63-318809 | 12/1988 |
| JP | 5-114836 | 5/1993 |

OTHER PUBLICATIONS

Nabicht, J. et al. "Low Voltage Current–Mode Filters: High Performance and Limitations", Proceedings of the Midwest Symposium on Circuits and Systems; Lafayette, Aug. 3–5, 1994, New York, IEEE, US, vol. 1, Symp. 37, pp. 103–106.

* cited by examiner

Primary Examiner—Dinh T. Le
(74) Attorney, Agent, or Firm—Arent Fox Kintner Plotkin & Kahn, PLLC

(57) ABSTRACT

A semiconductor amplification circuit having a pair of differential input terminals, and a first MOS transistor having a gate thereof connected to a mutual conductance controlling terminal. The semiconductor amplification circuit also includes a pair of second and third MOS transistors, and a pair of fourth and fifth MOS transistors. Furthermore, the semiconductor amplification circuit has first and second current sources connected to the source and drain of the first MOS transistor, respectively, and third and fourth current sources connected to the drains of the fourth and fifth MOS transistors, respectively. In addition, the semiconductor amplification circuit includes a pair of differential output terminals and first and second capacitances.

5 Claims, 11 Drawing Sheets

FILTER CHARACTERISTIC REGULATING APPARATUS AND REGULATING METHOD THEREFOR

This is a Division of application Ser. No. 09/362,707 filed Jul. 29, 1999 U.S. Pat. No. 6,307,427. The disclosure of the prior application is hereby incorporated by refer herein in its entirety.

BACKGROUND OF THE INVENTION

1. Field of the Invention

This invention relates to a filter characteristic regulating apparatus for regulating a characteristic frequency to a desired frequency in a filter device capable of regulating a characteristic frequency, and more particularly to a filter characteristic regulating apparatus having a simple construction that can be mounted onto one semiconductor chip together with the filter device, and to a method therefor.

2. Description of the Related Art

It has been desired in recent years to mount a continuous time filter, that is used for selectively adopting or rejecting weak signals, to a semiconductor integrated circuit with the improvement in the integration density of the semiconductor integrated circuit. Such a filter device has a characteristic frequency representing its characteristic feature. For instance, the center frequency is the characteristic frequency for a band-pass filter and the cut-off frequency is the characteristic frequency for a low-pass filter and a high-pass filter.

Generally, the characteristics of circuits mounted to the semiconductor integrated circuit fluctuate with fluctuation of a production process or the operating condition. Therefore, the characteristics of the filter device mounted to the semiconductor integrated circuit fluctuate, too, depending on the production process and the operating condition.

To keep the characteristics of the filter device mounted to the semiconductor integrated circuit to a desired value, a filter characteristic regulating apparatus for automatically regulating the characteristic frequency of the filter device to a desired frequency becomes necessary.

FIG. 1 is a block circuit diagram showing the filter device mounted to the semiconductor integrated circuit and the filter characteristic regulating apparatus according to the prior art. In FIG. 1, reference numeral 1 denotes a filter device capable of regulating a characteristic frequency thereof, and reference numeral 2 denotes a filter characteristic regulating apparatus according to the prior art. This filter characteristic regulating apparatus 2 includes an oscillator 3 capable of regulating an oscillation frequency, an oscillation frequency measuring instrument 4 for measuring the oscillation frequency of the oscillator 3, and a controller 5.

The controller 5 supplies, to the oscillator 3 and to the filter device 1, a characteristic controlling signal such that the oscillation frequency of the oscillator 3 becomes a constant frequency, on the basis of the measurement result of the oscillation frequency of the oscillator 3 by the oscillation frequency measuring instrument 4, and controls the oscillation frequency of the oscillator 3 as well as the characteristic frequency of the filter device 1.

In other words, the filter characteristic regulating apparatus 2 according to the prior art designs the oscillator 3 so that the oscillation frequency of the oscillator 3 and the characteristic frequency of the filter device 1 have a known correlation, and regulates the characteristic frequency of the filter device 1 to a desired frequency by controlling the oscillation frequency of the oscillator 3 to a constant oscillation frequency.

As described above, the conventional filter characteristic regulating apparatus 2 regulates indirectly the characteristic frequency of the filter device 1 by controlling the oscillation frequency of the oscillator 3, and such a filter characteristic regulating method is generally referred to as a "master-slave system". In this system, the filter characteristic regulating apparatus 2 is the master and the filter device 1 is the slave.

Incidentally, a relative value of each device constituting a semiconductor integrated circuit does not generally attain a design value but involves a certain variance (a few percent in a CMOS process). Therefore, if the values of the individual elements fluctuate in the conventional filter characteristic regulating apparatus 2, the actual correlation between the oscillation frequency of the oscillator 3 and the characteristic frequency of the filter device 1 becomes different from the correlation as designed.

The errors of the oscillation frequency of the oscillator 3 and the characteristic frequency of the filter device 1 from the design values due to relative variation of the individual element values correspond to the values that are inherent to each device. Therefore, it is difficult to estimate and correct such a value at the time of design, and such estimation and correction have not been done.

Under such circumstances, if the actual correlation between the oscillation frequency of the oscillator 3 and the characteristic frequency of the filter device 1 deviates from the design values in the conventional filter characteristic regulating apparatus 2, the characteristic frequency of the filter device 1 deviates from the desired frequency, and selectivity of the filter device 1 to the input signals is deteriorated.

When a high precision filter device is necessary, therefore, a filter device that is in advance regulated to high accuracy must be provided outside the semiconductor integrated circuit, and this hinders the reduction of the size and the cost of the overall apparatus requiring such a filter device.

Taking the problems described above into consideration, the prior art technology "Integrated Filter Circuit and Regulating Method thereof" disclosed in Japanese Unexamined Patent Publication (Kokai) No. 5-114836 is directed to provide a high precision active filter that can be incorporated into the semiconductor integrated circuit. However, the technology disclosed in claim 6 of this Japanese Unexamined Patent Publication (Kokai) No. 5-114836 first inputs a measuring signal to a filter device so as to obtain a response measuring signal, subjecting this signal to frequency transformation such as Laplace transformation and calculating a transfer characteristic of the filter. Next, secondary state variables Q and $\omega_0$ of a state-variable filter are calculated from this transfer characteristic and are then compared with state variables that are set in advance to determine an error between them. This error is fed back to the filter device in order to regulate the filter highly precisely.

As described above, the technology disclosed in Japanese Unexamined Patent Publication (Kokai) No. 5-114836 requires an extremely complicated process such as a Laplace transformation for determining the transfer characteristic of the filter. However, to accomplish such a complicated processing function by a semiconductor device such as an LSI, at least a plurality of LSIs are necessary. Therefore, it is almost impossible to incorporate the circuit accomplishing this regulating method with the filter device into one LSI.

As a matter of fact, Japanese Unexamined Patent Publication (Kokai) No. 5-114836 constitutes filters 42 to 44, D/A converters 45 to 50 and a ROM 57 inside the object apparatus (for example, one LSI), and accomplishes a circuit for an arithmetic operation, inclusive of a CPU, and a circuit for generating a regulating signal, by external circuits, as can be seen clearly from FIG. 3 of this reference.

SUMMARY OF THE INVENTION

To solve the problems of the prior art apparatuses described above, the present invention aims at providing a filter characteristic regulating apparatus that can be assembled with a filter device into the same LSI and can regulate automatically and highly precisely the characteristic frequency of the filter device.

To accomplish the object described above, the present invention provides a filter characteristic regulating apparatus comprising a measuring signal generator for generating a measuring signal having a known cycle of a response waveform when inputted to a filter device having a desired characteristic frequency; a selector for selecting the measuring signal and inputting it to the filter device when the filter device is not used; a response waveform cycle measuring instrument for measuring the cycle of the response waveform of the input measuring signal in the filter device; and a controller for comparing the cycle of the response waveform measured by the response waveform cycle measuring instrument with the known waveform cycle and regulating the characteristic frequency of the filter device to the desired value according to the comparison result.

In such a filter characteristic regulating apparatus, a signal the cycle of the response waveform of which is known at the design stage, when it is inputted to the filter device having the desired characteristic frequency, such as a step signal, is used as the measuring signal. This known cycle may be stored as a target cycle in the controller, or may be inputted from outside to the controller at the time of measurement of the filter characteristics.

To regulate the characteristic frequency of the filter device, the measuring signal is inputted to the filter device through the selector, and the cycle of the response waveform at that time is measured by the response waveform cycle measuring instrument. The cycle so measured is inputted to the controller, and is compared with the target cycle. The characteristic frequency of the filter device is controlled on the basis of this comparison result.

As described above, when the characteristic frequency of the filter device is regulated, the filter characteristic regulating apparatus according to the present invention can easily regulate the characteristic frequency of the filter device by detecting the response waveform cycle of the measuring signal without executing a complicated arithmetic process for determining the transfer function of the filter without using a Laplace transformation, etc. Therefore, the circuit construction becomes simple, and the apparatus can be mounted with the filter device onto one chip.

Incidentally, it is necessary to use an arithmetic operation such as a Laplace transformation or a circuit simulator in order to calculate the target cycle of the measuring signal, but such a calculation may be carried out at the stage of design, and means for the calculation need not be assembled into the characteristic frequency regulating apparatus.

DETAILED DESCRIPTION OF THE PREFERRED EMBODIMENTS

Hereinafter, filter characteristic regulating apparatuses according to the first and second embodiments of the present invention will be explained with reference to the accompanying drawings.

First Embodiment

Figure 1:
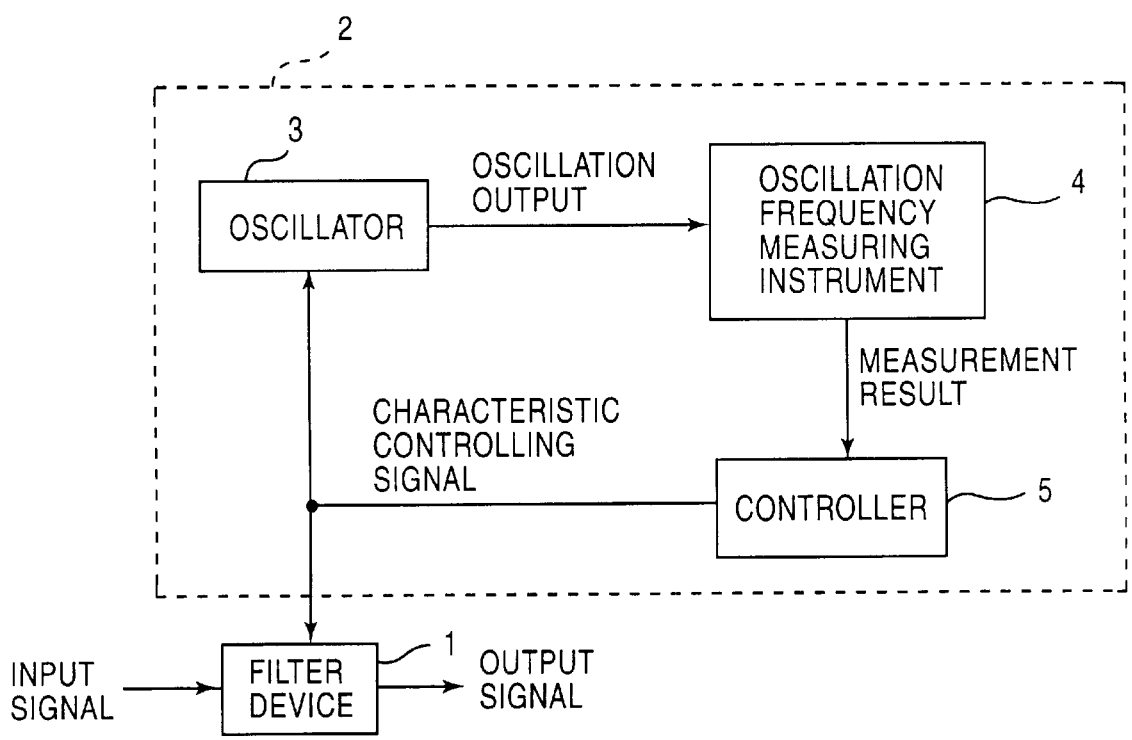
FIG. 1 is a block circuit diagram showing a filter device mounted to a semiconductor integrated circuit and a conventional filter characteristic regulating apparatus.
Figure 2:
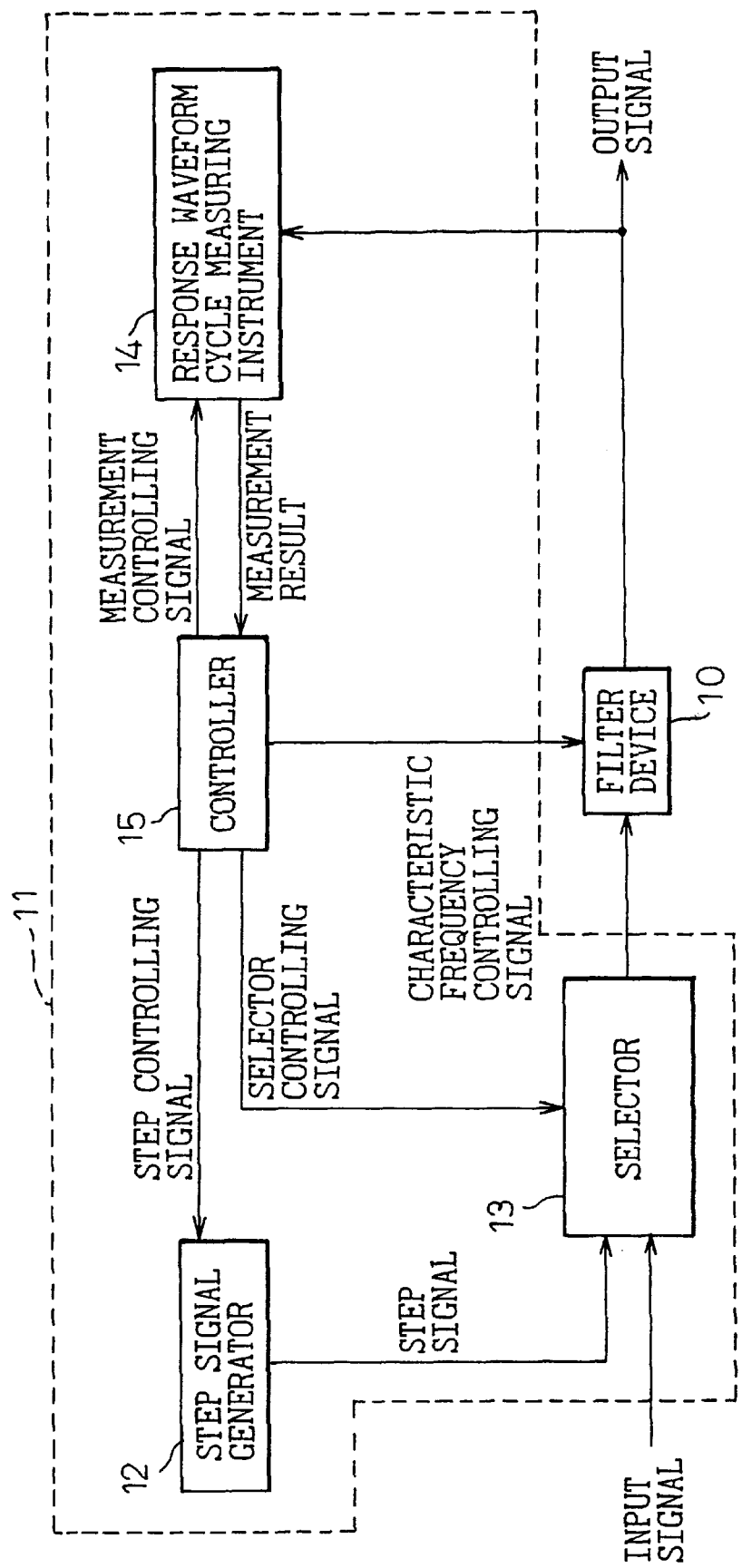
FIG. 2 is a block diagram showing a filter device mounted to a semiconductor integrated circuit and a filter characteristic regulating apparatus according to the first embodiment of the present invention.

FIG. 2 is a block circuit diagram showing a filter characteristic regulating apparatus according to the first embodiment of the present invention that is mounted onto one semiconductor integrated circuit (LSI) with a filter device. In FIG. 2, reference numeral 10 denotes a filter device capable of regulating a characteristic frequency, and reference numeral 11 denotes a filter characteristic regulating apparatus according to the first embodiment of the present invention.

In the filter characteristic regulating apparatus 11 of the first embodiment of the present invention, reference numeral 12 denotes a step signal generator for generating a step signal as a measuring signal, reference numeral 13 denotes a selector for selectively supplying an input signal and the step signal to the filter device, and reference numeral 14 denotes a response waveform cycle measuring instrument for measuring the cycle of the response waveform of the filter device 10 to the step signal.

Reference numeral 15 denotes a controller that executes the control of the step signal generator 12 by a step controlling signal, the control of the selector 13 by a selector controlling signal, the control of the response waveform cycle measuring instrument 14 by a measurement controlling signal, and regulation of the characteristic frequency of the filter device by a characteristic frequency controlling signal on the basis of the cycle measurement result of the response waveform of the filter device to the step signal by the response waveform cycle measuring apparatus 14.

Figure 3:
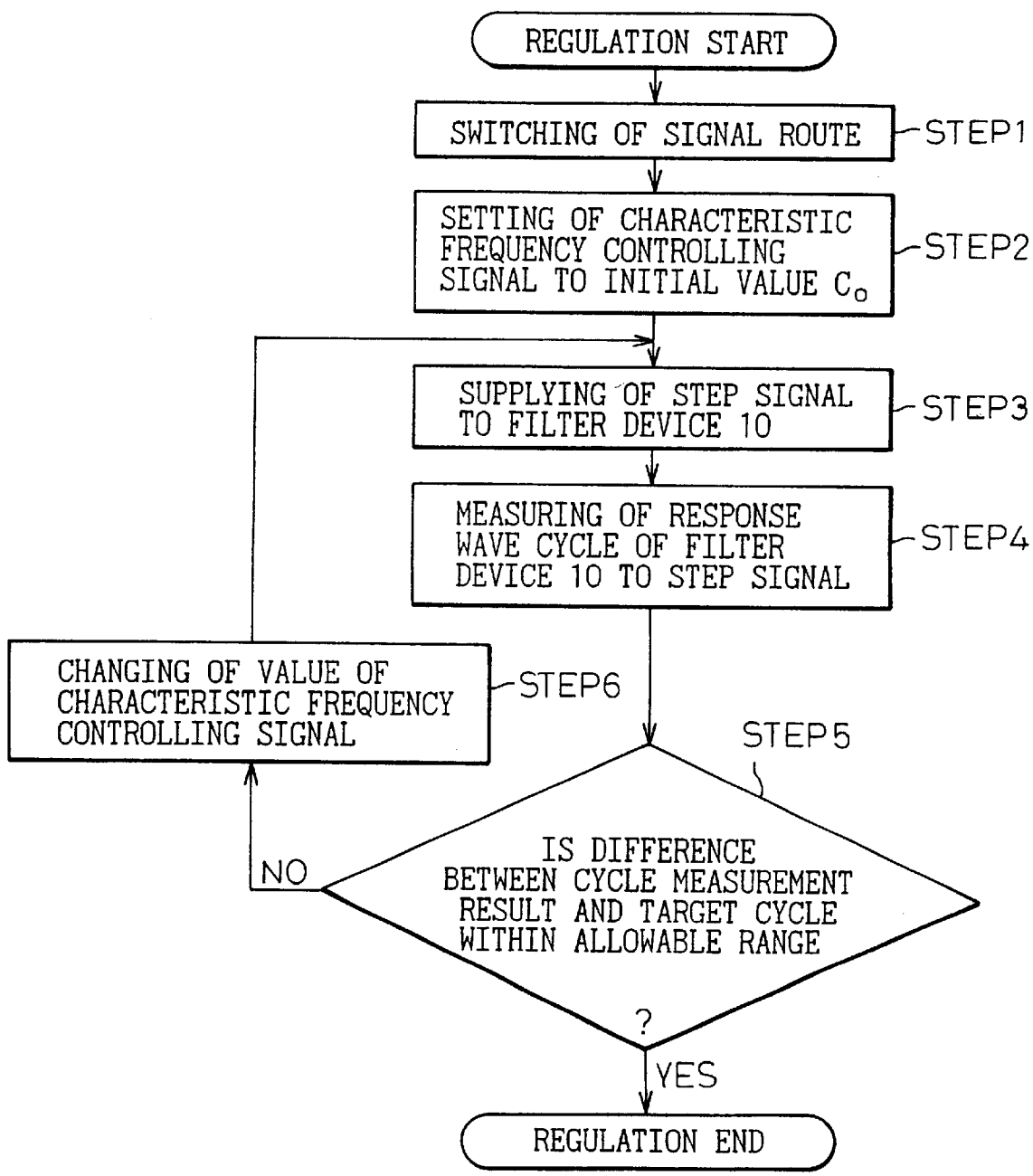
FIG. 3 is a flowchart showing an operation algorithm of a controller contained in the block diagram of FIG. 2.

This controller 15 mainly comprises a microprocessor capable of executing a program code describing a process sequence for regulating the frequency characteristic. FIG. 3 is a flowchart showing the algorithm of the process sequence in this controller 15.

In the filter characteristic regulating apparatus 11 according to the first embodiment of the present invention, the controller 15 first controls the selector 13 at the time of regulation of the characteristic frequency of the filter device 10, and switches the step signal outputted from the step signal generator 12 so that the step signal can be inputted to the filter device 10 (step S1).

Next, the controller 15 sets the frequency characteristic controlling signal of the filter device 10 to the initial value Co (step S2), controls the step signal generator 12, lets the step signal generator 12 generate the step signal and inputs the step signal to the filter device 10 (step S3). Furthermore, the controller 15 lets the response waveform cycle measuring instrument 14 start the cycle measurement of the response waveform of the filter device 10 to the step signal (step S4).

Incidentally, the initial value Co is appropriately determined in advance on the basis of the regulation value of the standard products in order to shorten the regulation time.

The controller 15 judges whether or not the difference ($\Delta T = To - T_{OT}$) between the cycle measurement result (To) outputted from the response waveform cycle measuring instrument 14 and a target cycle ($T_{OT}$) falls within an allowable range (step S5), and finishes regulation of the characteristic frequency of the filter device 10 when the difference between the cycle measurement result and the target cycle is within the allowable range.

The target cycle $T_{OT}$ may be stored inside the controller 15 at the stage of the product design, or may be inputted to the controller 15 from outside at the time of regulation of the filter characteristic.

When the difference between the cycle measurement result and the target cycle is outside the allowable range, the controller changes the value of the characteristic frequency controlling signal (step S6). The process flow then returns to the step S3, and the steps S3 to S5 are executed. Thereafter, the operations of the step S6 and the steps S3 to S5 are executed until the difference between the cycle measurement result and the target cycle falls within the allowable range. When the difference between the cycle measurement result and the target cycle falls within the allowable range, regulation of the characteristic frequency of the filter device 10 is completed.

When regulation of the characteristic frequency of the filter device 10 is thus completed, the controller 15 controls the selector 13 and switches the signal route so that the input signal can be supplied to the filter device 10.

Incidentally, the initial value Co of the characteristic frequency controlling signal to be set at the step S2 can be set to a value so that the center of the fluctuation of the characteristic frequency depending on the production process and on the operating condition exists in the proximity of the target value $T_{OT}$ when the initial value Co is set, as described already. In such a case, the regulating time of the characteristic frequency of the filter device 10 can be shortened.

A convenient method of measuring the cycle of the response waveform of the filter device 10 to the step signal, which method is to be executed at the step S4, compares this response waveform with a reference level by a comparator, and measures the cycle of the rise shift or fall shift of the output waveform of the comparator.

Figure 4:
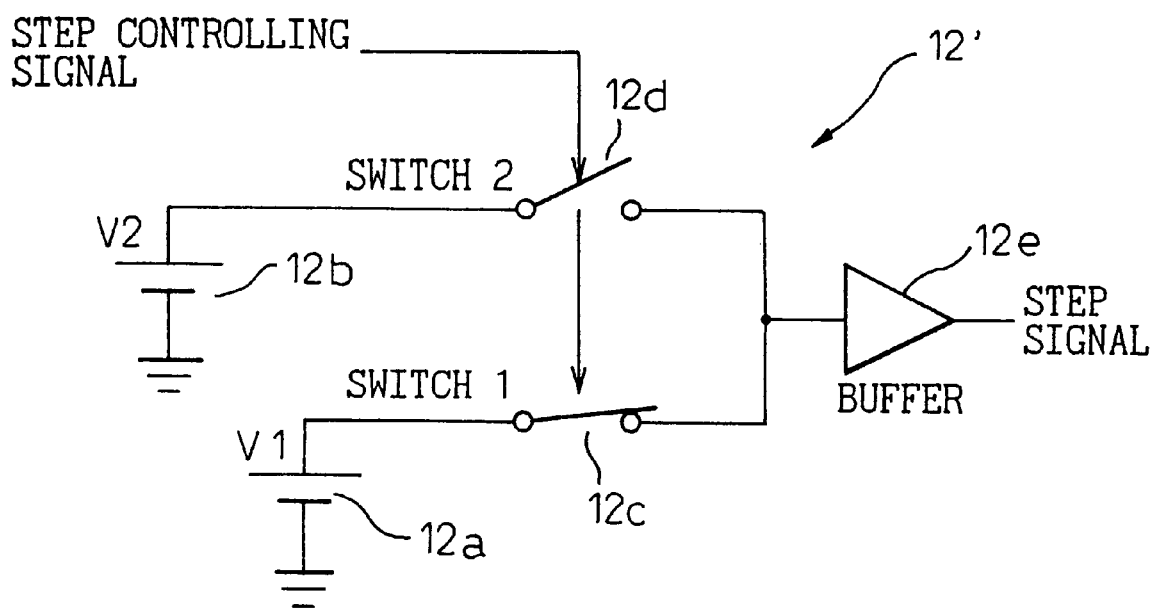
FIG. 4 is a circuit diagram showing an example of a step signal generator contained in the block diagram of FIG. 2.

FIG. 4 is a circuit diagram of the step signal generator 12 in the filter characteristic regulating apparatus 11 according to the first embodiment. This circuit 12' comprises, fundamentally, first and second constant voltage sources 12a and 12b, first and second switches 12c and 12d and a buffer 12e.

The constant voltage source 12a is set to a voltage V1 while the constant voltage 12b is set to a voltage V2. Each switch 12c and 12d is subjected to ON/OFF control by the step controlling signal from the controller 15.

This circuit 12' generates a step signal that shifts between the voltages V1 and V2 with the shift of the step controlling signal. This step signal is inputted to the selector 13 through the buffer 12e.

Figure 5:
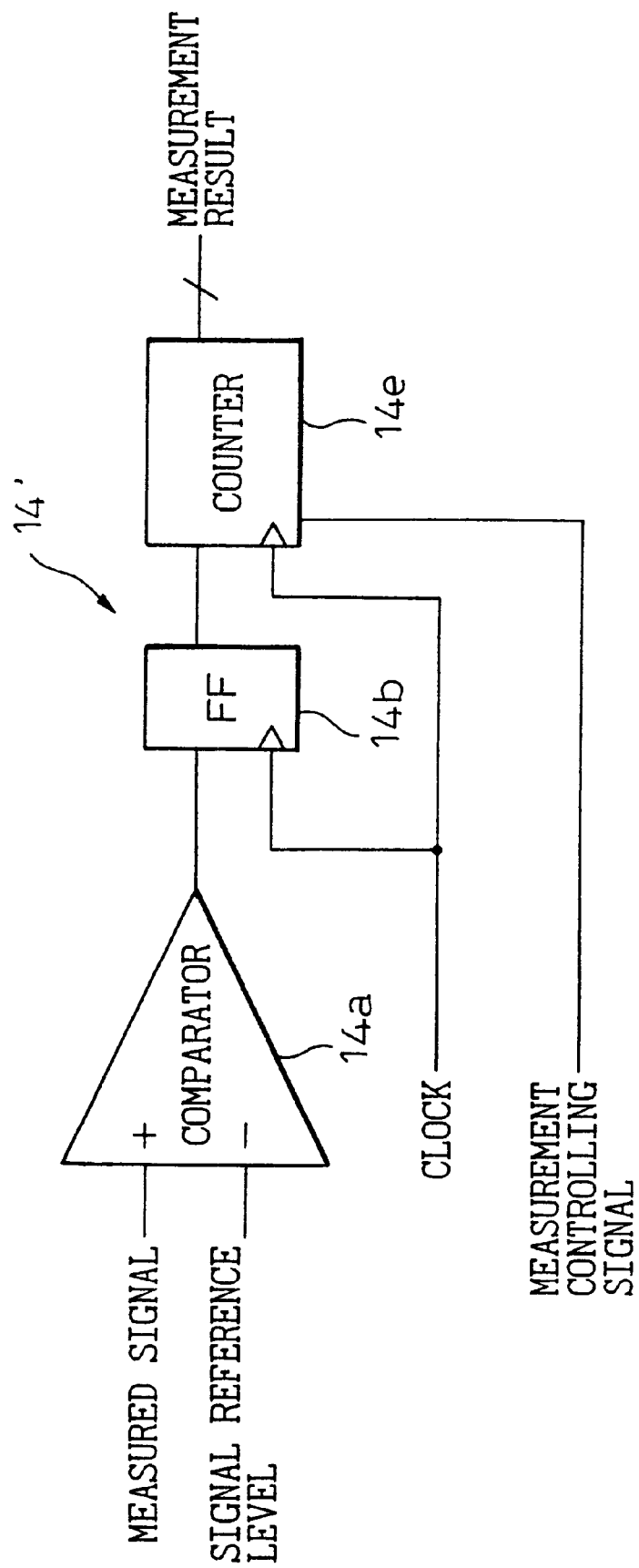
FIG. 5 is a circuit diagram showing an example of a response waveform cycle measuring instrument contained in the block diagram of FIG. 2.

FIG. 5 is a circuit diagram of the response waveform cycle measuring instrument 14 in the filter characteristic regulating apparatus 11 according to the first embodiment. This circuit 14' comprises a comparator 14a for inputting and comparing a measured signal with a signal reference level, a flip-flop 14b that constitutes a one-bit sampling circuit with this comparator 14a and a counter 14c for counting the output of the flip-flop 14b.

Figure 6:
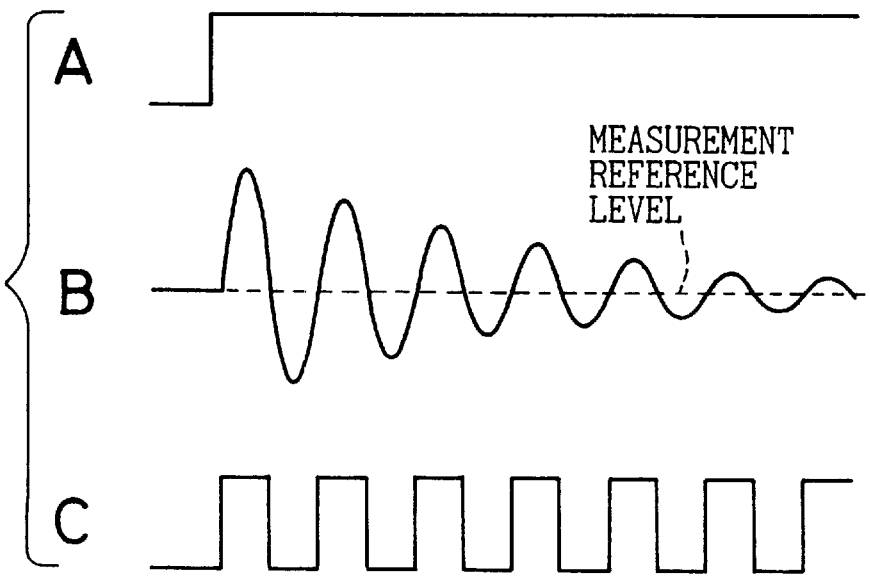
FIG. 6 is a waveform diagram useful for explaining a cycle measuring method of the response waveform of the filter device to the step signal when the filter device of the filter characteristic regulating apparatus according to the first embodiment of the present invention is a secondary bandpass filter.

Next, the operation of this circuit 14' will be explained with reference to FIG. 6.

Waveform A shows the step signal generated by the step signal generator 12. When this step signal is inputted to the filter device 10 through the selector 13, the response waveform B can be obtained as its output. This response waveform represents the waveform when the filter 10 is a secondary band-pass filter.

The response waveform B is inputted next to the response waveform cycle measuring instrument 14. In the circuit shown in FIG. 14', it is inputted as the measured signal to the comparator 14a. The comparator 14a compares this input waveform with the signal reference level and obtains a binary output C. Incidentally, the measurement reference level is set to the center level of the amplitude of the response waveform in this embodiment.

Next, the output of the comparator 14a is inputted to the flop-flop circuit 14b, and the cycle of the rise shift or fall shift of the comparator output waveform is measured. In the embodiment shown in FIG. 5, the output waveform of the comparator 14a is sampled by inputting a clock having a higher speed than the center frequency of the filter device 10, and the necessary cycle period is counted by the counter 14c. This measurement result can be obtained as a digital value.

In this case, the measuring error is approximately $f_o/(Nf_s)$ where N is the number of cycles of the response waveform of the filter device 10, $f_o$ is the center frequency of the filter device 10 and $f_s$ is the frequency of the clock used for sampling. Therefore, N and $f_s$ are selected so that the error falls within the desired error range.

The measurement result is sent to the controller 15 and the process steps after the steps S5 and so on are executed.

When the filter device 10 is a secondary band-pass filter, its transfer function F(s) is generally expressed by the following equation.

$$F(s) = \frac{\frac{2\pi f_0}{Q}}{s^2 + \frac{2\pi f_0}{Q}s + (2\pi f_0)^2}$$

Here, Q represents a characteristic factor called a "quality factor".

On the other hand, the Laplace transformation of the step signal is expressed by I(s)=A/s. Here, symbol A represents the amplitude of the step function.

Therefore, the Laplace transformation O(s) of the response waveform of the filter device 10 to the step signal I(s) is given as follows.

$$O(s) = F(s)I(s) = \frac{\frac{2A\pi f_0}{Q}}{s^2 + \frac{2\pi f_0}{Q}s + (2\pi f_0)^2}$$

When the expression 2 is subjected to inverse Laplace transformation, an expression 3 representing the response waveform of the filter device 10, that is, $$O(t) = \frac{A}{\sqrt{Q^2 - (1/4)}} e^{-\frac{\pi f_0}{Q}t} \sin 2\pi f_0 \sqrt{1 - (1/4Q^2)}\, t$$

can be obtained.

This expression represents a sine wave having a frequency that damps with a time constant $Q/\pi f_0$, $$f_0\sqrt{1-(1/4Q^2)}$$

Therefore, in order for the center frequency fo to attain the target frequency $f_{OT}$, the frequency of the response waveform of the filter device 10 to the step signal I(s) must satisfy:

$$f_{OT}\sqrt{1-(1/4Q^2)}$$

In the filter characteristic regulating apparatus 11 according to the first embodiment of the present invention, therefore, whether or not the difference ($\Delta T = T_O - T_{OT}$) between the cycle measurement result (To) outputted from the response waveform cycle measuring instrument 14 and the target cycle ($T_{OT}$) is within the allowable range is judged, and the characteristic frequency of the filter device 10 is regulated so that the difference between the cycle measurement result and the target cycle falls within the allowable range.

Incidentally, when the characteristic frequency of the filter device 10 is directly regulated by using the step signal, regulation must be effected once again if the operating condition (power source voltage, temperature, etc.) changes.

If the filter device 10 is a low order band-pass filter such as a secondary band-pass filter at the step S5, it is possible to analytically derive the relationship between the response waveform of the filter device 10 to the step signal and its center frequency fo, but if the filter device 10 is a band-pass filter of a high order (such as a 16-order band-pass filter), it is difficult to analytically derive the response waveform of the filter device 10 to the step signal.

However, in such a case, too, the relationship between the cycle of the response waveform of the filter device 10 to the step signal and the center frequency fo of the filter device 10 may be obtained numerically by using a circuit simulator, or the like.

Figure 7:
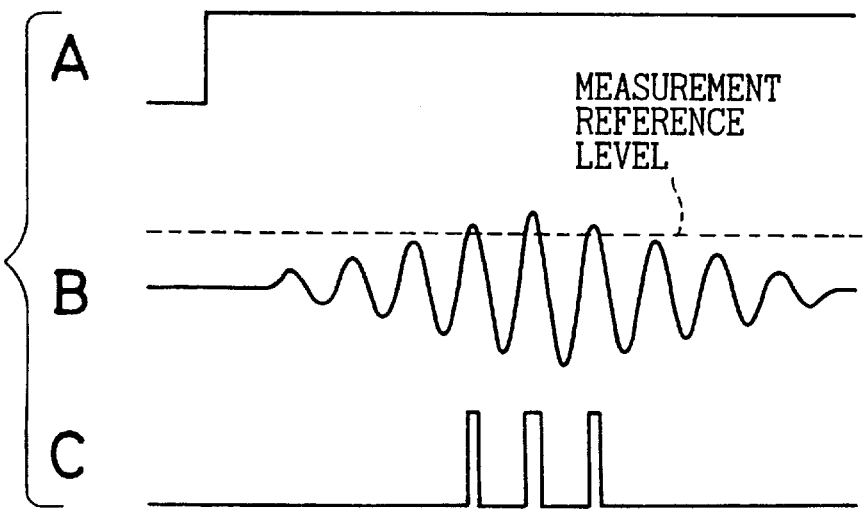
FIG. 7 is a waveform diagram useful for explaining the cycle measuring method of the response waveform of the filter device to the step signal when the filter device of the filter characteristic regulating apparatus according to the first embodiment of the present invention is a high-order bandpass filter.

FIG. 7 is a waveform diagram for explaining the cycle measuring method of the response waveform of the filter device 10 to the step signal when the filter device 10 is a high-order band-pass filter. Waveform A shows the step signal, waveform B shows the response waveform of the filter device 10 to the step signal, and waveform C shows the output waveform of the comparator obtained when the response waveform of the filter device 10 to the step signal and the measurement reference level are set to a level somewhat lower than the maximum amplitude level of the response waveform of the filter device 10 to the step signal.

When the filter device 10 is a secondary band-pass filter, fluctuation of the gain is small because the number of order is low, but when the filter device is a high-order band-pass filter, the gain of the pass point fluctuates because a plurality of poles and a zero point fluctuate relatively.

If the filter device 10 is a high-order band-pass filter, it is advisable to compare the response waveform of the filter device 10 to the step signal with the measurement reference level by the comparator by setting the measurement reference level to a level somewhat lower than the maximum amplitude level of the response waveform of the filter device 10.

In such a case, the cycle of the response waveform of the filter device 10 to the step signal can be measured by measuring the time between the center points of the H level portions of the output waveform of the comparator, and it is also possible to judge whether the gain of the filter device 10 is greater or smaller than the desired value by measuring the time in which the response waveform of the filter device 10 to the step signal exceeds the measurement reference level.

When the filter device 10 is a high-order band-pass filter, the time from the point at which the step signal occurs to the point at which the response waveform of the filter device 10 to the step signal attains the maximum, has a proportional relationship with the cycle of the response waveform. Therefore, the center frequency of the filter device can be measured by measuring the time at which the response wave attains the maximum amplitude.

Furthermore, the center frequency of the filter device and its gain can be measured simultaneously at the time of measurement of the gain, by determining the time from the center point of the time, at which the response waveform exceeds the measurement reference level, to the point at which the response waveform attains the maximum amplitude.

However, the measuring method of the center frequency by this system involves a greater error than the cycle measuring method using the output waveform of the comparator. Therefore, this system is used at the initial stage of regulation so as to roughly regulate the center frequency and the gain, and regulation is carried out at its latter stage by the cycle measuring method using the output waveform of the comparator. In this way, the regulation time of the characteristic frequency of the filter device 10 can be shortened.

As described above, the filter characteristic regulating apparatus 11 according to the first embodiment of the present invention measures the cycle of the response waveform of the filter device 10 to the step signal when the filter device 10 is not used, and directly measures fluctuation of the characteristic frequency of the filter device 10, and can regulate highly precisely the characteristic of the filter device 10. Therefore, this embodiment can regulate with high accuracy the characteristics of the filter device 10.

Therefore, when the filter characteristic regulating apparatus 11 of the first embodiment is used, the filter device that is adjusted, in advance, highly precisely is not required even when a high precision filter device is required. When the filter characteristic regulating apparatus 11 of the first embodiment is mounted with the filter device 10 to the semiconductor integrated circuit, the overall size of the semiconductor device requiring the filter device, and its cost of production, can be reduced.

Second Embodiment

Figure 8:
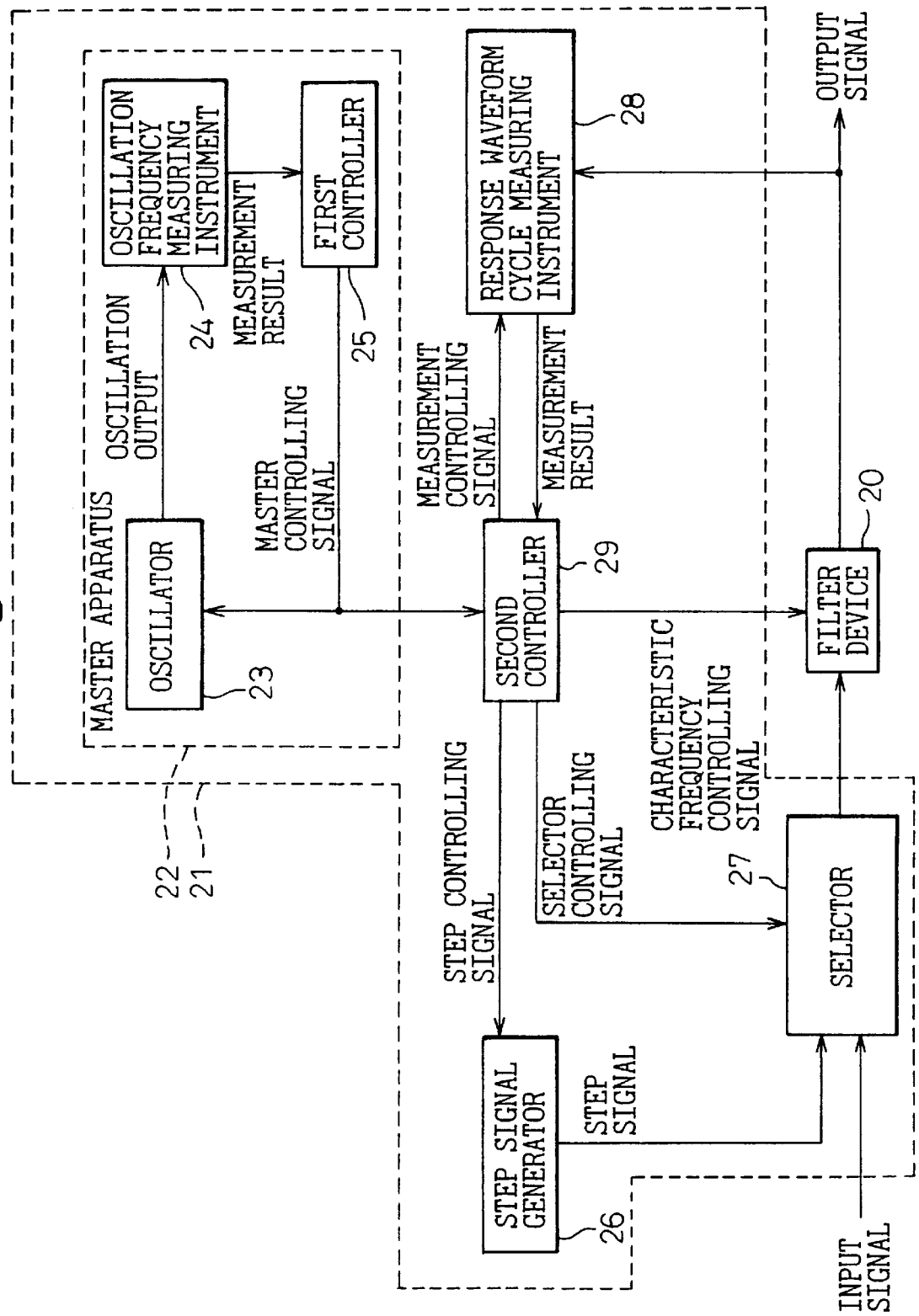
FIG. 8 is a block circuit diagram showing a filter device mounted to a semiconductor integrated circuit and a filter characteristic regulating apparatus according to the second embodiment of the present invention.

FIG. 8 is a block circuit diagram showing a filter device mounted to a semiconductor integrated circuit and a filter characteristic regulating apparatus according to the second embodiment of the present invention. In the drawing, reference numeral 20 denotes a filter device the characteristic frequency of which can be regulated, and reference numeral 21 denotes the filter characteristic regulating apparatus according to the second embodiment of the present invention.

In the first embodiment described above, the characteristic frequency must be again regulated if the operating condition (the voltage power source and the temperature) fluctuates. The following second embodiment provides an apparatus that automatically regulates the characteristic frequency even when the operating condition fluctuates and can therefore use the filter device continuously. In other words, the second embodiment provides an apparatus comprising the combination of the conventional master-slave system with the apparatus of the first embodiment.

In the filter characteristic regulating apparatus 21 according to the second embodiment of the present invention, reference numeral 22 denotes a master apparatus, reference numeral 23 denotes an oscillator capable of controlling its oscillation frequency, and reference numeral 24 denotes an oscillation frequency measuring instrument for measuring the oscillation frequency of the oscillator 23. Incidentally, the oscillator 23 is designed so that its oscillation frequency has a known correlation with the characteristic frequency of the filter device 20.

Reference numeral 25 denotes a first controller for supplying a master controlling signal to the oscillator 23 and to the later-appearing second controller. The master controlling signal is such that the oscillation frequency of the oscillator 23 becomes constant frequency, on the basis of the measurement result of the oscillation frequency of the oscillator 23 by the oscillation frequency measuring instrument.

The master apparatus 22 regulates the characteristic frequency during the use of the filter device 20 to a desired frequency because the oscillator 23 is designed so that its oscillation frequency and the characteristic frequency of the filter device 20 have a known correlation, and the master apparatus 22 thus controls the oscillation frequency of the oscillator 23 to a constant oscillation frequency.

Reference numeral 26 denotes a step signal generator for generating a step signal as a measuring signal, reference numeral 27 denotes a selector for selectively supplying the input signal or the step signal to the filter device 20, and reference numeral 28 denotes a response waveform cycle measuring instrument for measuring the cycle of the response waveform of the filter device 20 to the step signal.

Reference numeral 29 denotes a second controller that executes the control of the step signal generator 26 by a step controlling signal, the control of the selector 27 by a selector controlling signal, the control of the response waveform cycle measuring instrument 28 by a measurement controlling signal and regulation of the characteristic frequency of the filter device 20 by a characteristic frequency controlling signal on the basis of the measurement result by the response waveform cycle measuring instrument and on the basis of a master controlling signal outputted from the controller 25.

When the filter device 20 is not used in the filter characteristic regulating apparatus 21 according to the second embodiment having the construction described above, the step signal generator 26, the selector 27, the response waveform cycle measuring instrument 28 and the controller 29 operate in the same way as the step signal generator 12, the selector 13, the response waveform cycle measuring instrument 14 and the controller 15 of the filter characteristic regulating apparatus 11 of the first embodiment, respectively, in order to regulate the characteristic frequency, and regulate the characteristic frequency of the filter device 20 to a target frequency.

When the filter device 20 is so set as to operate for the input signal after the characteristic frequency of the filter device 20 is regulated by the step signal generator 26, the selector 27, the response waveform cycle measuring instrument 28 and the controller 29 as described above, the master apparatus and the controller 29 keep the characteristic frequency of the filter device 20 at the frequency that is regulated when the frequency device is not used.

As described above, the filter characteristic regulating apparatus 21 according to the second embodiment of the present invention can directly measure the fluctuation of the characteristic frequency of the filter device 20, and can regulate the characteristic frequency of the filter device 20 to a desired frequency based on the measurement result of this measurement by measuring the cycle of the response waveform of the filter device 20 to the step signal when the filter device 20 is not used. Therefore, this embodiment can regulate highly precisely the characteristics of the filter device 20.

Furthermore, even when the operating condition such as power source voltages, the temperature, etc., fluctuates during the use of the filter device, the master apparatus 22 automatically regulates the frequency characteristics and consequently, the filter device can be used continuously.

Therefore, when the filter characteristic regulating apparatus 21 according to the second embodiment of the present invention is used, a filter device regulated to high preciseness needs not be used even when a high precision filter device is necessary. When the filter characteristic regulating apparatus 21 of this invention is mounted with the filter device 20 to the semiconductor integrated circuit, the overall size and the cost of production of the semiconductor integrated circuit apparatus requiring the filter device can be reduced.

The filter characteristic regulating device according to the second embodiment provides the specific effect, that cannot be obtained by the filter characteristic regulating apparatus 11 of the first embodiment, that even when the operating condition changes, the characteristic frequency of the filter device can be kept at the frequency regulated at the time when it is not used.

Incidentally, in the filter characteristic regulating method and apparatus according to the present invention, it is necessary to use, as a measuring signal, acyclic signals containing the full frequency of the fluctuation range of the characteristic frequency of the filter device as a frequency component, and examples of such acyclic signals include the step signal (u(s)=1/s) and an impulse signal (σ(s)=1).

Therefore, although the filter characteristic regulating method and apparatus according to the first and second embodiments of the present invention has thus been described for the case where the step signal is used as the measuring signal, the impulse signal may be used in place of the step signal. However, the use of the step signal is preferred because the step signal provides a greater amplitude of the response waveform of the filter device.

Hereinafter, some embodiments of the filter devices 10 and 20 described above will be further illustrated. Each of the circuits shown in FIGS. 9, 12, 13 and 14 is a semiconductor amplifier having an OTA (Operational Transconductance Amplifier) construction using MOS transistors, and the filter device is constituted by connecting a capacitive load C to this amplifier.

Figure 9:
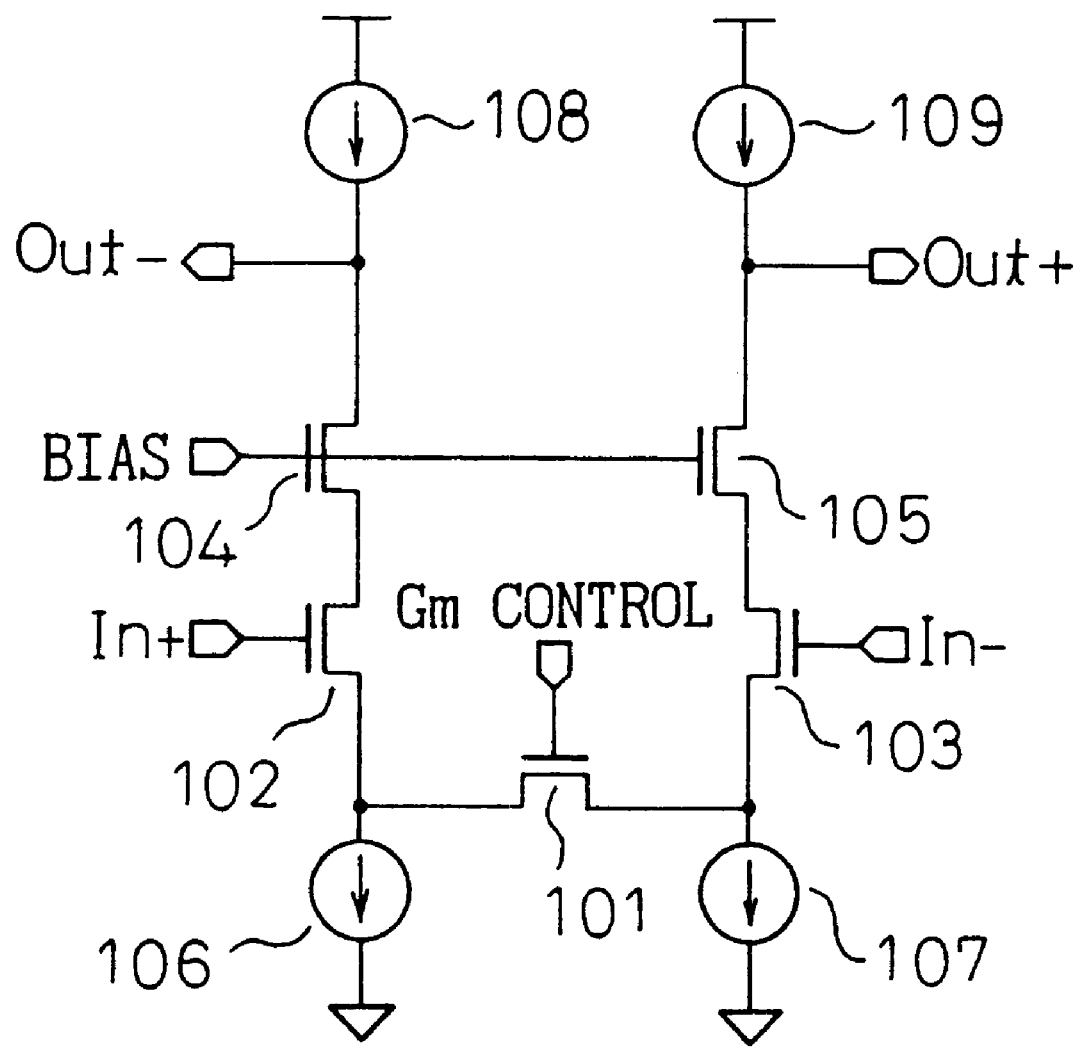
FIG. 9 is a circuit diagram showing a conventional OTA circuit for constituting a filter device.

FIG. 9 shows the circuit construction of the OTA that is used generally. This OTA circuit includes a first MOS transistor 101 operating in a linear region and second and third MOS transistors 102 and 103 the gates of which are connected to differential input terminals In+ and In−, respectively, and the sources of which are connected between the source and drain of the MOS transistor 101. Sources of fourth and fifth MOS transistors 104 and 105 are connected to the drains of the MOS transistors 102 and 103 in order to input a predetermined bias voltage signal. Incidentally, this bias signal is inputted to the gates of the MOS transistors 104 and 105.

Furthermore, first and second current sources 106 and 107 are connected to the source and drain of the first MOS transistor while third and fourth current sources 108 and 109 are connected to the drains of the fourth and fifth MOS transistors 104 and 105. Differential output terminals Out+ and Out− are interposed between the drains of the fourth and fifth MOS transistors 104 and 105 and the current sources 108 and 109, respectively.

Incidentally, mutual conductance Gm of the OTA circuit shown n FIG. 9 is controlled by a voltage inputted to the gate of the first transistor 101 as a Gm controlling terminal. The fourth and fifth MOS transistors 104 and 105, to which the bias signal is inputted, are disposed so as to increase the output resistance Ro of the OTA circuit.

Figure 10:
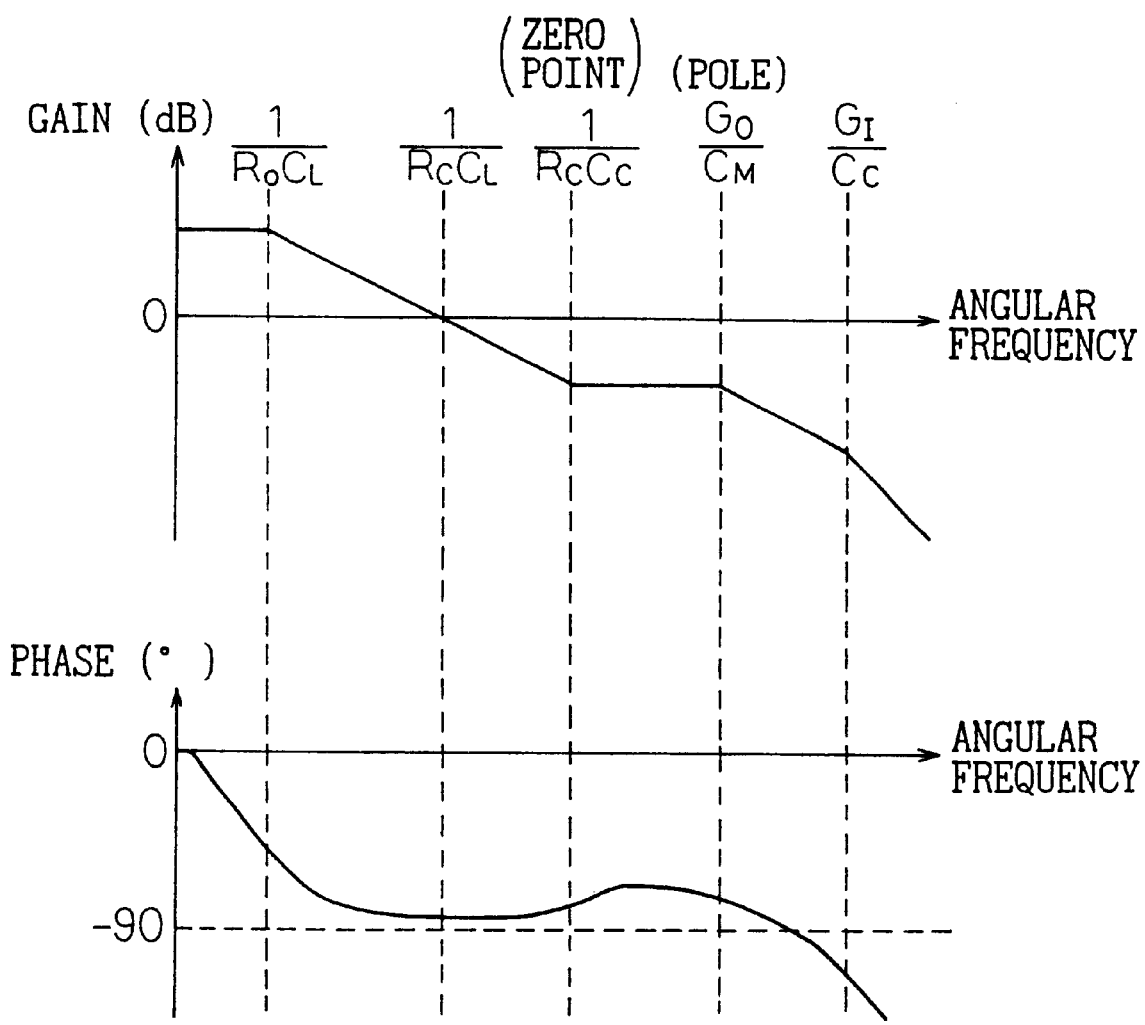
FIG. 10 is a graph showing a gain-phase characteristic when the OTA circuit shown in FIG. 9 is used as an integrator.
Figure 11:
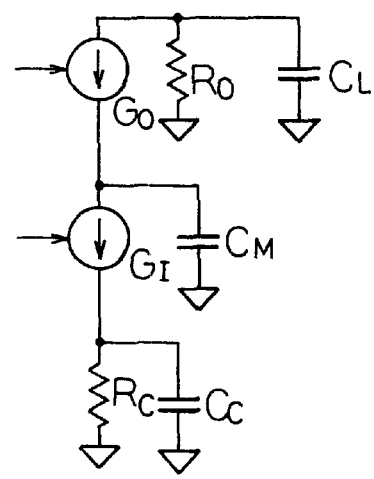
FIG. 11 is an equivalent circuit diagram of an integrator exhibiting the characteristic shown in FIG. 10.

In the general OTA circuit described above, the capacitive load $C_L$ is connected to each of its output terminals Out+ and Out− to thereby constitute an integrator. FIG. 10 is a gain-phase characteristic diagram of the integrator so constituted. FIG. 11 shows the equivalent circuit diagram of the integrator that is constituted on the basis of the gain-phase characteristic diagram of FIG. 10. Incidentally, the equivalent circuit of FIG. 11 is shown as a simplified, single-ended circuit.

In FIG. 11, symbol Ro represents an output resistance and symbol $C_L$ represents the capacitive load for constituting the integrator. The pair of the MOS transistors 104 and 105 shown in FIG. 9 is used in order to increase this output resistance Ro. Symbol Go represents the output conductance that is determined by the pair of MOS transistors 104 and 105 shown in FIG. 9. Symbol $C_M$ represents a parasitic capacitance (mainly a channel capacitance and a junction capacitance) resulting from the pair of the fourth and fifth MOS transistors 104 and 105, and this parasitic capacitance is applied mainly to the drain terminals of the pair of the second and third MOS transistors 102 and 103.

Symbol Gr represents an input conductance, which is determined by the pair of the MOS transistors 102 and 103.

Symbol Rc represents the ON resistance of the MOS transistor 101 operating in the linear region, and symbol Cc represents the parasitic capacitance resulting from the first, second and third MOS transistors 101, 102 and 103. Incidentally, the value of the ON resistance Rc of the MOS transistor 101 is limited by the voltage of the Gm controlling terminal.

In the integrator having the circuit construction described above, the characteristic angular frequency of the integrator is $1/(Rc\ C_L)$ with its gain at 0 dB.

In the integrator using the OTA circuit in FIG. 9, the zero point and the pole of parasiticity are formed by the parasitic capacitance Cc at an angular frequency 1/(RcCc) and at an angular frequency $Go/C_M$, respectively, as shown in FIG. 10. As the phase of the integrator advances due to the existence of the zero point of parasiticity 1/(RcCc) in the use band, the phase curve is lifted up from −90° as shown in the phase characteristic diagram of FIG. 10, and performance of the integrator is deteriorated. As a result, the Q value of the filter drops, too, and the design of a filter having a high Q value becomes difficult.

In order to obtain an integrator having ideal characteristics, therefore, such a zero point that narrows the operation range of the integrator preferably does not exist, but such zero point and pole are unavoidable so long as MOS transistors are used.

When the parasitic capacitance Cc is decreased, this zero point 1/(RcCc) of parasiticity shifts towards the high frequency side with the result that the lift-up point of the phase shown in FIG. 10 also shifts towards the high frequency side and the adverse influences of this zero point become small. To decrease the parasitic capacitance Cc, the sizes of the MOS transistors 1, 2 and 3 operating in the linear region must be reduced. When the sizes of these transistors are reduced, however, the relative accuracy of the Gm value is deteriorated. Therefore, an attempt to improve the frequency characteristics of the integrator by decreasing the parasitic capacitance cannot be successful.

It is possible to make up for the adverse influences of the existence of the zero point on the phase characteristics by shifting the pole $GO/C_M$ of parasiticity in the direction of the zero point of parasiticity, that is, towards the low frequency side, instead of shifting the zero point 1/(RcCc) of parasiticity shown in FIG. 10 towards the high frequency side by decreasing the parasitic capacitance Cc. When the angular frequency advances from the pole $Go/G_M$ of parasiticity in the characteristic diagram shown in FIG. 10, the gain starts dropping again, so that the phase curve that is once lifted up by the influences of the zero point, too, starts lowering again towards −90°.

Ideally, therefore, when the pole $Go/C_M$ of parasiticity is shifted down to the zero point 1/(RcCc) of parasiticity towards the lower frequency side, the influences of this zero point are compensated for, and the phase can keep an angle near −90° towards a higher frequency side, and performance as the integrator can be improved. Symbol Go represents the output conductance that is determined by the pair of MOS transistors 104 and 105 connected to the bias terminal, and this value cannot be easily changed.

Therefore, the pole $Go/C_M$ of parasiticity is shifted towards the lower frequency side by adjusting the value of the capacitance $C_M$ occurring in the drains of the pair of transistors 102 and 103 so as to compensate for the adverse influences of the zero point.

Figure 12:
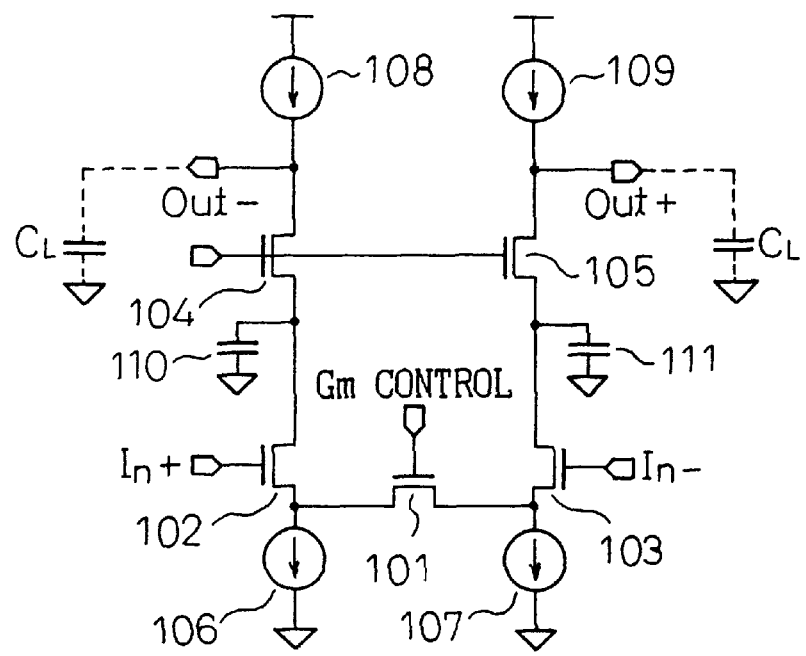
FIG. 12 is a circuit diagram of a novel OTA circuit for constituting a filter device.

FIG. 12 is a circuit diagram of another example of the OTA circuit that can be used as the filter device. As shown in this circuit diagram, this embodiment is characterized in that capacitances 110 and 111 are added afresh to the sources of the pair of transistors 104 and 105 in the OTA circuit shown in FIG. 9. Though one of the ends of each capacitance 110 and 111 is shown grounded in FIG. 12, it need not always be grounded but may be connected to a fixed potential.

The value of each capacitance 110 and 111 is selected so that its synthetic value CM with the parasitic capacitance $C_M$ resulting from the MOS transistors 104 and 105 is as close as possible to the value 1/(Rc Cc). In this way, the adverse influences of the zero point due to the parasitic capacitance Cc on the integrator characteristics can be reduced without increasing relative variance of the Gm value. Consequently, the integrator of the Gm-C construction comes close to the characteristics of an ideal integrator.

When the integrator, that is, the filter device 10 or 20 shown in FIG. 2 or 8, is constituted by this OTA circuit, the load capacitance $C_L$ is connected to each output terminal Out+ and Out− as indicated by dotted lines.

Furthermore, the characteristic frequency controlling signal from the controller 15 shown in FIG. 2 is inputted to the Gm controlling terminal of this OTA circuit.

Figure 13:
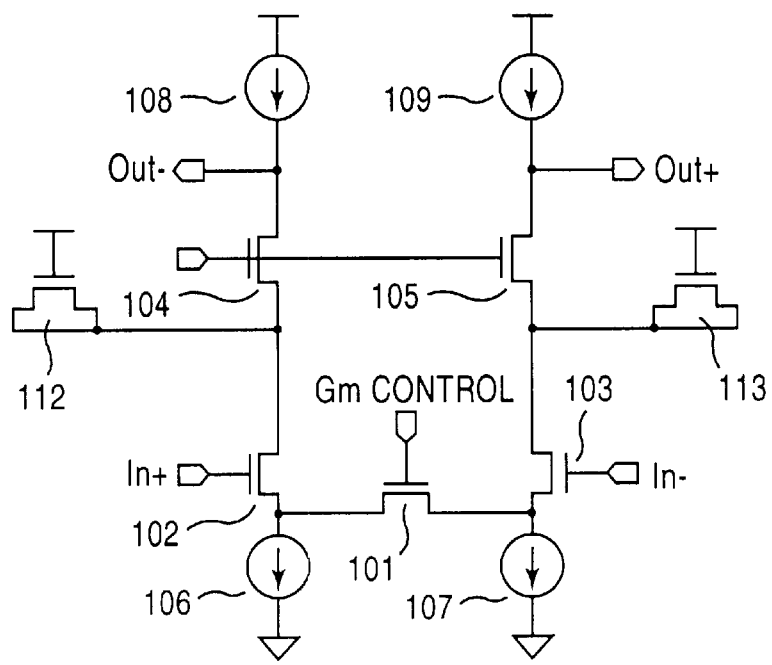
FIG. 13 is a circuit diagram of another novel OTA circuit for constituting a filter device.

FIG. 13 shows the OTA circuit according to still another embodiment. This embodiment is characterized in that each capacitance 110, 111 described above comprises MOS transistors 112 and 113. The source and drain of each of these MOS transistors 112 and 113 are mutually connected while their gates are connected to a fixed potential as shown in FIG. 13 so that these transistors operate as a capacitance.

When a semiconductor device is produced in practice, this embodiment makes it possible to produce the MOS transistors 112 and 113 in the same production process as other MOS transistors. Therefore, the parasitic capacitance Cc of the MOS transistors that generates the zero point and the capacitance of the MOS transistors 112 and 113 that generates the pole possess a proportional relationship, and the shift of the parasitic zero point due to the fluctuation of the capacitance Cc becomes equal to the shift of the pole due to the fluctuation of the capacitance CM. As a result, the capacitance CM is not affected by the fluctuation of the capacitance Cc resulting from the fluctuation of the production process, and the design result can be obtained.

Figure 14:
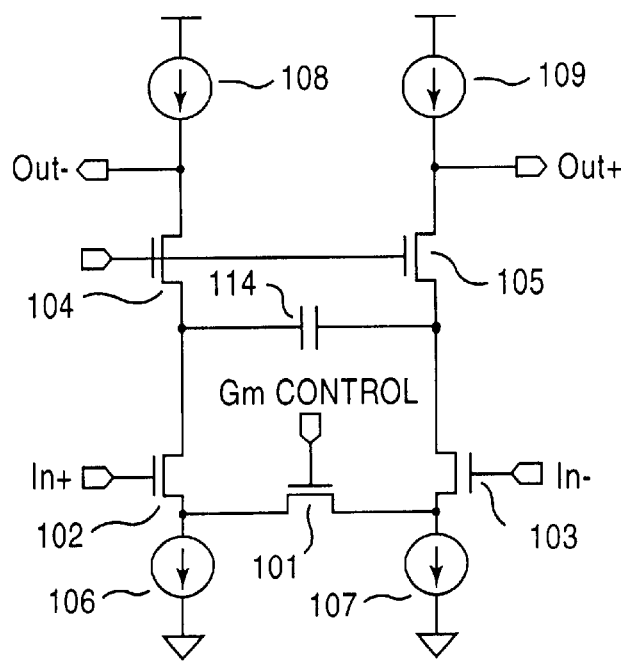
FIG. 14 is a circuit diagram of still another novel OTA circuit for constituting a filter device.

FIG. 14 shows the third embodiment of the OTA circuit. This embodiment is directed to reduce as much as possible the values of the capacitances 110 and 111 shown in FIG. 12. Therefore, this embodiment employs the construction wherein a non-polar capacitance 114 is connected between the sources of the pair of the MOS transistors 104 and 105. According to this construction, the necessary capacitance becomes ¼ in comparison with the embodiments shown in FIGS. 12 and 13.

The OTA circuits described above can reduce as much as possible the influences of the zero point due to the parasitic capacitance without increasing relative variance of the Gm value. When this OTA circuit is used as the integrator of the Gm–C construction, therefore, its angular frequency-phase characteristic becomes approximate to the characteristic of an ideal integrator, and a filter having a high Q value and capable of being mounted to a semiconductor integrated circuit can be obtained. In consequence, the present invention makes a great contribution to the reduction of the overall size of the apparatus using the filter.

What is claimed is:

1. A semiconductor amplification circuit comprising:
   a pair of differential input terminals;
   a first MOS transistor having a gate thereof connected to a mutual conductance controlling terminal;
   a pair of second and third MOS transistors having the gates thereof connected to said differential input terminals and sources thereof connected to either one of the source and drain of said first MOS transistor;
   a pair of fourth and fifth MOS transistors having the gates thereof connected to a constant bias signal input terminal and the sources thereof connected to the drains of said second and third MOS transistors, respectively;
   first and second current sources connected to the source and drain of said first MOS transistor, respectively;
   third and fourth current sources connected to the drains of said fourth and fifth MOS transistors, respectively;
   a pair of differential output terminals disposed between the drains of said fourth and fifth MOS transistors and said third and fourth current sources; and
   first and second capacitances having one end thereof connected to the sources of said fourth and fifth MOS transistors, respectively, and one other end thereof connected to a fixed potential.

2. A semiconductor amplification circuit according to claim 1, wherein a plurality of values of said first and second capacitances are determined so that a parasitic zero originated from a parasitic capacitance resulting from said first, second and third MOS transistors are compensated for by a parasitic pole generated by a sum of the parasitic capacitances resulting from said fourth and fifth MOS transistors and said first and second capacitances, in an open-loop frequency response of the semiconductor amplification circuit.

3. A semiconductor amplification circuit according to claim 1, wherein said first and second capacitances comprise sixth and seventh MOS transistors having the gates thereof connected to a fixed potential and the sources an drains thereof connected in common and connected also to the sources of said fourth and fifth MOS transistors.

4. A semiconductor amplification circuit according to claim 1, wherein said first and second capacitances comprise one capacitance connected between the sources of said fourth and fifth MOS transistors.

5. An integrator comprising a semiconductor amplification circuit and a load capacitance connected to differential output terminals of said semiconductor amplification circuit, said semiconductor amplification circuit comprising:
   a pair of differential input terminals;
   a first MOS transistor having a gate thereof connected to a mutual conductance controlling terminal;
   a pair of second and third MOS transistors having the gates thereof connected to said differential input terminals and the sources thereof connected to either one of the source and drain of said first MOS transistor;
   a pair of fourth and fifth MOS transistors having the gates thereof connected to a constant bias signal input terminal and the sources thereof connected to the drains of said second and third MOS transistors, respectively;
   first and second current sources connected to the source and drain of said first MOS transistor, respectively;
   third and fourth current sources connected to the drains of said fourth and fifth MOS transistors, respectively;
   a pair of differential output terminals disposed between the drains of said fourth and fifth MOS transistors and said third and fourth current sources, respectively; and
   first and second capacitances having one of the ends thereof connected to the sources of said fourth and fifth MOS transistors and the other end thereof connected to a fixed potential.

* * * * *